United States Patent
Klosiewicz (12)

(10) Patent No.: US 6,663,970 B1
(45) Date of Patent: Dec. 16, 2003

(54) EPOXY/RESIN ALLOYS

(75) Inventor: Daniel W. Klosiewicz, Wilmington, DE (US)

(73) Assignee: Eastman Chemical Resins Inc., Kingsport, TN (US)

( * ) Notice: Subject to any disclaimer, the term of this patent is extended or adjusted under 35 U.S.C. 154(b) by 0 days.

(21) Appl. No.: 08/792,601

(22) Filed: Jan. 31, 1997

Related U.S. Application Data

(60) Provisional application No. 60/011,209, filed on Feb. 6, 1996.

(51) Int. Cl.$^7$ ................................................. B32B 27/38
(52) U.S. Cl. ....................... 428/416; 428/413; 427/386; 524/474; 524/490; 525/97; 525/98; 526/280; 526/281; 526/283
(58) Field of Search ......................... 523/463; 524/474, 524/490; 525/97, 98; 526/280, 281, 283; 428/413, 416, 418; 427/386

(56) References Cited

U.S. PATENT DOCUMENTS 4,701,481 A * 10/1987 Bogan et al. ................ 523/428
4,904,760 A * 2/1990 Gaku et al. .................. 528/422

* cited by examiner

*Primary Examiner*—Robert Dawson
*Assistant Examiner*—Christopher M. Keehan
(74) *Attorney, Agent, or Firm*—Polly C. Owen; Bernard J. Graves, Jr.

(57) ABSTRACT

The instant invention relates to an epoxy/alkylation-type hydrocarbon resin alloy comprising an epoxy resin, an alkylation-type hydrocarbon resin, and a curative. The alkylation-type hydrocarbon resin is characterized as a product formed by an alkylation reaction between a cyclic diolefin and aromatic solvent. A particularly effective alkylation-type hydrocarbon resin in this invention is the alkylation resin formed by the reaction of dicyclopentadiene (DCPD) with alkylnaphthalene solvent. The alkylation-type hydrocarbon resin can be readily dissolved into various epoxy resins and easily processed into resin impregnated glass cloth prepreg for ultimate conversion into electronic laminate products. These epoxy/alkylation-type hydrocarbon resin alloys retain high Tg values with minimal increase in thermal expansion.

34 Claims, No Drawings

EPOXY/RESIN ALLOYS

CROSS REFERENCE TO RELATED APPLICATION

This application claims the benefit of U.S. Provisional Application No. 60/011,209, filed on Feb. 6, 1996, the disclosure of which is incorporated herein by reference in its entirety.

FIELD OF THE INVENTION

The instant invention relates to a blending of hydrocarbon resin into epoxy resin and subsequently curing the epoxy to form a modified thermoset alloy of hydrocarbon resins in a cured epoxy matrix. Hydrocarbon resins of utility in the instant invention are formed by an alkylation reaction between cyclic diolefins such as dicyclopentadiene (DCPD) and aromatic solvents.

The alloys of the instant invention are of particular utility as binders for use with matrix materials, such as glass fabrics, for use in making laminate products for electronics.

BACKGROUND OF THE INVENTION

Epoxy resins are commonly used as binders for making glass fabric reinforced laminate products for electronics applications. In these applications, epoxy resin, combined with a curative, is applied in liquid form (neat or as a solution) to glass fabric. The fabric containing the epoxy is then dried at elevated temperatures to remove volatiles from the epoxy and to partially cure the epoxy thereby yielding an intermediate product typically termed a "prepreg". Laminates can be constructed from prepregs by layering sheets of prepreg in various combinations and orientations and typically placing copper foil layer on one or both of the outside layers of the laminate to form a laminate structure. The laminate structure is then compressed with the application of heat and pressure to form electronic laminate products comprised of metal foil(s) bonded to cured epoxy/glass fabric sheets.

Typically, epoxies used in electronic laminate are Bisphenol A diglycidylether epoxy resins where a required amount of bromine has been reacted onto an epoxy molecule to confer flame retardance to cured product. Laminate produced from this type of epoxy is typically classified as FR-4 type.

Cured epoxy resins provide several desirable properties required for electronic laminate application such as infusibility, high glass transition temperature, solvent resistance, adhesion to copper, flame retardance, among other characteristics. However epoxy resins are inherently polar in character, and this polarity causes other undesirable properties commonly associated with epoxy resins such as high moisture absorption and higher dielectric constant and dissipation factor (higher than measured for many common polymers).

One potential technique for producing a material which retains the desirable attributes of epoxy resin and desirable attributes associated with a non-polar material is to form an alloy of non-polar polymer(s) blended into and cured with the epoxy resin itself. An example of such an alloy is a product produced and sold by General Electric as Getek® polymer. The alloy comprises an alloy of polyphenyleneether (PPE) polymer mixed with an epoxy resin, where this alloy is applied and used as the binder in electronic laminate products. While this alloy offers some property advantages, it suffers from the fact that the PPE polymer and epoxy resin are highly incompatible. This incompatibility leads to both processing problems and product variability. The latter problem is attributed to difficulties associated with consistent formation of a desired phase separation between the PPE and epoxy.

One solution to this problem is to use a non-polar hydrocarbon polymer which is soluble and compatible with epoxy resins. However non-polar polymers such as polypropylene, polyethylene, polystyrene, PPE, or hydrocarbon rubbers such as polyisoprene, polybutadiene, and the like are incompatible with epoxy resins. Compatibility can be improved by reducing the molecular weight of the polymer. One type of non-polar low molecular weight polymer are materials typically classified as hydrocarbon resins. Examples of such hydrocarbon resins include Kristalex® 3100 resin or Picco® 5140 resin available from Hercules Incorporated. These materials are low molecular weight polymers derived from pure styrenic monomers in the former case or mixed unsaturated aromatic feedstocks in the latter case. However even low MW oligomers such as these hydrocarbon resins display poor solubility and compatibility with epoxy resins.

BRIEF DESCRIPTION OF THE INVENTION

The instant invention relates to an epoxy/alkylation-type hydrocarbon resin alloy comprising an epoxy resin, an alkylation-type hydrocarbon resin, and a curative. The epoxy resin may be a Bisphenol A diglycidylether epoxy resins where a required amount of bromine has been reacted onto an epoxy molecule. The alkylation-type hydrocarbon resin is characterized as a product formed by an alkylation reaction between a cyclic diolefin and aromatic solvent. One particularly effective alkylation-type hydrocarbon resin in this invention is the alkylation resin formed by the reaction of dicyclopentadiene (DCPD) with alkylnaphthalene solvent. The resin exhibits a high glass transition temperature (Tg) at very low number average molecular weight values (MW), less than about 10,000, preferably less than 5,000, most preferably less than 3,000, measured by size exclusion chromatography. The alkylation-type hydrocarbon resin is added to the epoxy resin at levels up to about 25% by weight, preferably between about 10% to 25% by weight, more preferably about 17.5% to 20% by weight.

The instant invention also relates to a process of producing an epoxy/alkylation-type hydrocarbon resin alloy comprising the steps of: dissolving an alkylation-type hydrocarbon resin in a liquid epoxy to form a mixture; adding a curative to the alkylation-type hydrocarbon resin/epoxy mixture; impregnating a matrix with the alkylation-type hydrocarbon resin/epoxy mixture containing the curative; and advancing the epoxy's cure to provide the epoxy/alkylation-type hydrocarbon resin alloy.

Additionally, the invention relates to a prepreg comprising; a matrix impregnated with the epoxy/alkylation-type hydrocarbon resin alloy as well as laminates produced from such prepregs.

DETAILED DESCRIPTION OF THE INVENTION

Alkylation hydrocarbon resins is an alternate way to hydrophobically modify the properties of epoxy materials. use of an alkylation-type hydrocarbon resin reduces processing difficulties associated with PPE alloys and forms a product which is hydrophobically modified.

One particularly effective alkylation-type hydrocarbon resin for this application is the alkylation resin formed by the reaction of dicyclopentadiene (DCPD) with alkylnaphthalene solvent, described in U.S. Pat. No. 5,391,670. Because of the rigid molecular structure of this material, it exhibits a high glass transition temperature (Tg) at very low number average molecular weight values (MW), less than about 10,000, preferably less than 5,000, most preferably less than 3,000, measured by size exclusion chromatography. Because of its aromatic character and low MW, the alkylation-type hydrocarbon resin can be readily dissolved into various epoxy resins and easily processed into resin impregnated glass cloth prepreg for ultimate conversion into electronic laminate products. These epoxy/alkylation-type hydrocarbon resin alloys retain high Tg values with minimal increase in thermal expansion. Incorporation of the non-polar alkylation-type hydrocarbon resin into an epoxy reduces moisture sensitivity and improves dielectric properties of the epoxy relative to the unmodified epoxy. Because of compatibility between in the epoxy and alkylation resin, other important properties such as degree of cure, solvent resistance, mechanical properties, thermal stability, and adhesive characteristics are not deteriorated despite the fact that the alkylation-type hydrocarbon resin does not co-cure with the epoxy matrix and retains its thermoplastic characteristics in epoxy/alkylation-type hydrocarbon resin alloy.

Alkylation-type hydrocarbon resin formed by the alkylation reaction between cyclic diolefins such as dicyclopentadiene (DCPD) and aromatic solvents exhibit almost universal solubility in a range of solvents and are highly soluble and compatible in various types of epoxy resins. Because of this high degree of compatibility, up to 25 vol % of alkylation-type hydrocarbon resin can be blended into epoxy resins and the mixture subsequently cured to form a modified thermoset alloy of alkylation-type hydrocarbon resin in a cured epoxy matrix. Due to the alkylation-type hydrocarbon resin's hydrophobic character, these alloys exhibit reduced moisture sensitivity and improved dielectric properties. One application for alloys of this type is in electrical laminate products where improved dielectric properties and lower moisture sensitivity are highly desirable properties for the binders used in these products. Because of the compatibility between these alkylation resins and epoxy materials, the alloys retain good mechanical properties, solvent resistance, adhesion properties, and thermal stability, within the limits of compatibility of the alkylation-type hydrocarbon resin in epoxy matrix.

One particular class of oligomers found to be compatible in epoxy resins despite its non-polar character. This class is characterized as the product formed by an alkylation reaction between a cyclic diolefin and aromatic solvent. An example of such a material is the hydrocarbon resin described in U.S. Pat. No. 5,391,670, incorporated herein by reference in its entirety, which was found to be particularly suited for use as a non-polar, compatible polymer for alloying with epoxy resins. The resin(s) described in this patent are products derived from an alkylation reaction between diolefins and polycyclic aromatic species. Preferably the resin, being the alkylation products formed by reaction between dicyclopentadiene (DCPD) and a mixed alkylnaphthalene solvent. Because of this product's rigid structure formed by combining cyclic naphthalene structures to the olefin sites of a rigid DCPD structure, the resultant resin exhibits a high glass transition temperature (Tg) at very low molecular weight values. Such a material can exhibit a Tg of around 80° C. at a "true" number average MW of about 400 Daltons. Also, because of the character of alkylation reaction, the resin formed through reaction of DCPD contains a high percentage of aromatic solvent residues in its structure. Thus, although the resin is non-polar and hydrocarbon in nature, it is highly aromatic and is more compatible with polar materials than aliphatic-type materials.

Other alkylation-type hydrocarbon resins suitable as compatible modifiers for epoxy resins would be an alkylation product formed by an reaction between DCPD and a benzene aromatic solvent, such as xylene. An example of this type of material is Piccovar® L-60 resin available from Hercules Incorporated. However due to the smaller size of benzene's aromatic structure, alkylation-type hydrocarbon resins formed from benzene exhibit lower molecular weights and glass transition temperatures than alkylation-type hydrocarbon resins derived from alkylation of alkyl naphthalene solvents. Typical resins derived from alkylation of benzene exhibit a Tg about 50° C. to 70° C. lower than similar products made by alkylating naphthalene solvents, such as the products described in U.S. Pat. No. 5,391,670.

In practice a process for producing an epoxy/alkylation-type hydrocarbon resin alloy comprises the following steps. In a first step, the alkylation-type hydrocarbon resin is dissolved in liquid epoxy resins or solutions of epoxy resin in solvents such as MEK or acetone. Resins described in U.S. Pat. No. 5,391,670 were found to be soluble in common epoxy resins such as Epon 828 liquid epoxy resin available from Shell Chemical, or Epon 1123-A80, an 80% solution of a brominated Bis A epoxy resin in acetone, also available from by Shell Chemical. In a second step, a curative is added to the alkylation-type hydrocarbon resin/epoxy mixture. A variety of materials well known in the art may be used to cure the epoxy contained in the alkylation-type hydrocarbon resin/epoxy mixture. The curing agent may be selected from the group consisting of dicyanodiamide (DICY) and imidazole. Typically, the curative is added as a solution in a solvent, and typically the solvent is a polar solvent.

In electrical laminate production, typical curative solutions consist of dicyandiamide and a hindered amine co-catalyst dissolved in a polar solvent such as dimethylformamide (DMF) or a mixture of DMF and alcohols or other polar solvents. In the third step, a matrix, preferably glass cloth, is impregnated with the alkylation-type hydrocarbon resin/epoxy mixture containing the curative and any associated solvents and passed through an oven to remove volatile solvent and advance the degree of cure of the epoxy to provide a resultant epoxy/alkylation-type hydrocarbon resin alloy exhibiting a requisite material flow when subsequently laminated.

The alkylation-type hydrocarbon resin of this invention remains dissolved in the epoxy as a binder when it is applied to the matrix and does not substantially hinder coating, drying, or laminating of prepreg containing this resin as a binder. The alkylation-type hydrocarbon resin can be incorporated into the epoxy at levels up to around about 20%–25% by weight before saturation or compatibility limit of alkylation-type hydrocarbon resin in the epoxy is reached. Above the compatibility limit, properties of the epoxy/alkylation-type hydrocarbon resin alloy begin to deteriorate. Below the compatibility limit, important properties such as infusibility, solvent resistance, mechanical strength, adhesive properties, thermal stability, and thermal expansion are little affected.

In terms of volume fraction, up to around 25 vol % of the alkylation-type hydrocarbon resin can be incorporated into the epoxy before the compatibility limit is reached. Alloying the alkylation-type hydrocarbon resin into the epoxy reduces moisture sensitivity of the epoxy. Dielectric properties are also modified, the alkylation-type hydrocarbon resin causing a reduction in dielectric constant and dissipation factor.

Adding the alkylation-type hydrocarbon resin does cause a modest reduction in the Tg of the cured epoxy/alkylation-type hydrocarbon resin alloy relative to the Tg for the epoxy itself. These materials cause only a modest Tg reduction of 5°–15° C. even at high loading of 20–25 vol %. While alkylation-type hydrocarbon resin addition has a moderate effect on Tg, its effect on thermal expansion is even less pronounced. Thermal expansion of the epoxy/alkylation-type hydrocarbon resin alloy, measured by heating samples of the material from 25° C. to 250° C. in a thermo-mechanical analysis (TMA) apparatus, is little affected by incorporation of the alkylation-type hydrocarbon resin. Although adding alkylation-type hydrocarbon resin causes a modest reduction in Tg, cured binder compositions exhibiting Tg values in the range 120° C. to 140° C. can be prepared from these alkylation-type hydrocarbon resin alloyed with conventional brominated Bis A epoxy resin.

In order to more clearly describe the present invention, the following non-limiting examples are provided. Unless stated otherwise, all percentages, parts, etc. are by weight.

EXAMPLES

Examples 1, 1B

An alkylation resin was formed by the reaction between DCPD and a mixed alkylnaphthalene solvent (Sure-Sol® 205 solvent, available from Koch Chemical). To prepare this product 800 grams of the mixed alkylnaphthalene solvent was added along with 1.0 g. acetic acid to a 2 liter round bottom reaction flask equipped with mechanical stirrer, dropping funnel, nitrogen purge line, thermometer, and vent. After purging the reaction flask with nitrogen, 6.0 g. anhydrous aluminum chloride was added to the solvent and stirred until a uniform, dark red mixture resulted. After adding the catalyst, a mixture of 100 g. solvent+100 g. DCPD 108 (95% purity grade DCPD available from Lyondell Petrochemical) was dropwise added to the mixture at a steady rate around 15 cc/min. into the reaction flask, originally at 25° C. A vigorous exotherm results as the DCPD was added. Cooling was applied to the reaction flask at 50° C. to maintain this reaction temperature.

After all the DCPD was added to the reactor, the mixture was held for 10 minutes at 50° C. and then purified of the catalyst by adding 300 g. hexane to the reaction mixture and washing it 3 times with water, decanting the water wash off between subsequent washes. After recovering the washed organic solution, the solvent was stripped off by heating the mixture in a boil-up flask to 250° C. under a nitrogen stream until volatile evolution slowed and then passing steam through the remaining non-volatile product while holding the temperature at 250° C. and stripping until devolatilization was complete. A hard resin product was recovered at a 275% yield based on DCPD (275 g. product). Properties of this alkylation-type hydrocarbon resin are listed below.

| Typical Properties | |
|---|---|
| Specific Gravity | 1.10 |
| Softening Point, Ring and Ball, ° C. | 120 |
| Glass Transition Temperature, Tg, ° C. | 80 |
| OMS Cloud Point, ° C. | 40/30 |
| Mixed Methylanaline Cloud Point, ° C. | −3 |
| Color, Gardner | 6–8 |
| Solution Viscosity, 75% in MEK, cps | 1,260 |
| Chemical Reactivity | Inert |

| -continued | |
|---|---|
| Typical Properties | |
| Moisture Absorbtion | Minimal |
| Dielectric Constant | 2.7 |
| Dissipation Factor | .0003 |

| Solubility | |
|---|---|
| Toluene (and all aromatics) | VS |
| Mineral Spirits | S |
| Cyclohexane | S |
| n-Hexane | I |
| Isopropanol | I |
| 1/1 IPA/Toluene | S |
| Methyl Cellosolve | I |
| 2/1 Methyl Cellosolve/Toluene | S |
| p-Dioxane | S |
| Epon 828 Epoxy resin | S |
| MEK | VS |
| Butyl Acetate | S |
| Methyl Cellosolve Acetate | S |
| Dimethylformamide (DMF) | S |
| Acetone | SS |
| 5/1 Acetone/Toluene | S |
| Butyl Carbitol | SS |
| 5/1 BuCarbitol/Toluene | S |
| Epoxy Novolac Resins | S |
| Epon 1123 A-80 Brominated Epoxy | S |

VS = Very Soluble
S = Soluble
SS = Slightly Soluble
I = Insoluble

The resin was essentially non-reactive and non-polar in nature and exhibits very low moisture absorbtion, low dielectric constant, and dielectric dissipation factor. Despite its non-polar character and high Tg, the alkylation-type hydrocarbon resin exhibited a wide solubility in epoxy resins and a range of polar solvents.

In Example 1B, a resin was prepared in the same manner as Example 1 except that the amount of mixed alkylnaphthalene solvent added to the reactor at the start was reduced to 450 g. The final mass balance of the reaction is 100 g. of DCPD reacted in the presence of a total of 550 g. of mixed alkylnaphthalene solvent added into the reactor. The ratio of solvent used relative to DCPD reacted affects the molecular weight of the resin formed. In Example 1B, 265 g. of resin was recovered (265% yield) having a 135° C. ring and ball softening point.

Examples 2–4

The 135° C. softening point alkylation-type hydrocarbon resin of Example 1B was added to an epoxy formulation to characterize its properties as an alloying material. The epoxy resin used was a 50/50 mixture of DER 332 Bis A epoxy and DER 521 A-80 brominated epoxy, (both available from Dow Chemical). This mixture was stripped in a rotory evaporator to remove the acetone solvent in the DER 521. This epoxy blend was used as a control formulation in Example 2 (comparative). In Example 3 the alkylation-type hydrocarbon resin of Example 1B was dissolved into the epoxy mixture of Example 2 at a 15 wt % level based on the total formulation. The mixture was a homogeneous liquid blend. In example 4, the alkylation-type hydrocarbon resin of Example 1B was similarly added at a 30% level by weight to the epoxy resin blend of Example 2. This mixture was likewise a homogeneous liquid initially. The same curative was added to all three blends. Fine ground dicyanodiamide (DICY) was added to these epoxy blends at a level of 3 parts DICY per 100 parts of epoxy mixture, and 2-Methylimidazole cocatalyst was likewise added at a level of 0.1 part per hundred epoxy mixture (phr). The mixtures were warmed and poured into $\frac{1}{8}$" thick molds and cured for 3 hours at 175° C. Properties of the epoxy/alkylation-type hydrocarbon resin alloy samples were compared in the table below to values for the unmodified epoxy control.

|  | Example 2 (comparative) | Example 3 | Example 4 |
|---|---|---|---|
| Additive | — | 15% Example 1B | 30% Example 1B |
| Compatibility | Yes, clear | Good, Clear | V. Poor, Hazy |
| Solvent Resistance | Excellent | Excellent | V. Poor |
| Glass Transition (° C.) | 139 | 131 | — |
| Flexural Modulus (kg/cm$^2$) | 29,000 | 32,000 | — |
| Flexural Strength (kg/cm$^2$) | 1,102 | 1,136 | Weak |
| Dielectric Constant (1 Khz) | 4.27 | 3.95 | — |
| Dissipation factor (1 Khz) | 0.0079 | 0.0044 | — |
| Moisture Absorbtion (10 day immersion at 66° C.) | 1.83% | 1.42% | — |

Example 4 exhibited severe phase separation of the alkylation-type hydrocarbon resin and the properties of the epoxy/alkylation-type hydrocarbon resin alloy were severely compromised. The alkylation-type hydrocarbon resin was readily extracted from the cured alloy and the mechanical strength was visibly compromised. This level of alkylation-type hydrocarbon resin (35 vol %) exceeded its compatibility limit in the epoxy, severely compromising the properties of the epoxy/alkylation-type hydrocarbon resin alloy, and no further testing was done. In contrast, Example 2 was clear after curing and the alkylation-type hydrocarbon resin appeared very compatible at this loading. The alloy of Example 2 exhibited good mechanical properties and solvent resistance despite the presence of the thermoplastic alkylation-type hydrocarbon resin. Alloying the epoxy resin with alkylation-type hydrocarbon resin reduced its moisture sensitivity and lowered its dielectric constant and dissipation factor.

Examples 5–7

In Example 5 (comparative), Epon 1123 A-80 brominated epoxy resin was combined with a curative solution containing 10% DICY+0.3% 2-Methylimidazole (2-MI) to give a coating solution containing 3.3 parts by weight of DICY for every 100 parts of epoxy resin. A sheet of glass cloth, style 7628-38 with #643 amine finish (available from Burlington Glass Fabric Co.) was impregnated with this epoxy solutions and drawn between two doctor blade to get a wet-coated glass cloth. This wet-coated glass cloth was dried for 105 seconds in a forced air oven at 170° C. and a dry, non tacky prepreg sample resulted. The dried prepreg was found to contain about 46% binder and 54% glass. In Example 6, a 70% solution of the resin of Example 1 in toluene was combined with Epon 1123 A-80 epoxy resin at a 1/5 ratio to give a solution where the ratio of alkylation-type hydrocarbon resin to epoxy was 17.5/100. This solution was combined with the curative and converted into prepreg in the same fashion as in Example 5. A prepreg was prepared in Example 7 similar to the prepreg of Example 6 except that the solution containing 70% of the alkylation-type hydrocarbon resin of Example 1 was added at a ratio of 3.5/1, to give a solution where the ratio of alkylation-type hydrocarbon resin to epoxy was 25/100. In Examples 6 and 7, the coating and drying was no more difficult than with the control formulation, Example 5. The quality of the prepregs of Examples 6 and 7 in terms of smoothness and uniformity were at least a good as the prepreg made in Example 5.

Prepreg samples of Examples 5 to 7 were layered either 3 ply or 7 ply thick and laminated and cured in a hydraulic press for 2 hours at 177° C. Samples of the cured laminates were tested for moisture absorbtion, dielectric properties and thermal expansion by thermomechanical analysis (TMA). The effect of adding the resin of example 1 to the epoxy is illustrated by the comparisons in the table below.

|  | Example 5 (comparative) | Example 6 | Example 7 |
|---|---|---|---|
| Brominated Epoxy Resin | 100 | 100 | 100 |
| Example 1 Alkylation Resin | — | 17.5 | 25 |
| DICY | 3.25 | 3.25 | 3.25 |
| 2-MI | 0.10 | 0.10 | 0.10 |
| wt. % Binder in Prepreg | 47% | 46% | 46% |
| Dielectric Constant (1 Khz) | 4.59 | 4.30 | 4.27 |
| Dissipation Factor (1 Khz) | 0.0068 | 0.0039 | 0.0033 |
| Volume Resistivity (ohm-cm) | 7.7 E15 | 2.3 E16 | 2.8 E16 |
| Moisture Adsorbtion (10 day immersion at 66° C.) | 1.12% | 0.78% | 0.66% |
| Tg (by TMA) | 123 | 112 | 111 |
| Thermal Expansion Coefficient (ppm/° C. in 25° C. to 250° C. range) | 181 | 207 | 214 |

Examples 8–10

In Example 8 (comparative), a prepreg was prepared in a similar manner as in Example 5 except that the weight of epoxy binder coated on the glass was reduced to 40 wt %. Example 8 serves as a control, containing only Epon 1123 A-80 epoxy resin in the binder. In Example 9 prepreg was made similar to Example 8 except that an 80% solution of the alkylation-type hydrocarbon resin of Example 1 in MEK was added to the epoxy resin in the proportion 20 parts resin solution per 100 parts of Epon 1123 A-80. In Example 10 prepreg was likewise prepared from an epoxy solution similar to Example 9 except that 20% of the brominated epoxy resin (solids basis) was substituded with Epon 828 non-brominated epoxy resin. In Example 11 prepreg was prepared in the fashion of Example 9 except that the alkylation-type hydrocarbon resin added to the epoxy was a 135° C. softening point resin prepared as described in Example 1B.

After coating, the impregnated glass sheets were dried and B-staged for 150 seconds at 170° C. The final dry prepreg was found to contain 40% binder/60% glass. Laminates were prepared from the prepreg by layering up several plys of prepreg and press laminating them and curing the binder for 2 hours at 185° C. Additionally laminates were made with 1 oz. electrodeposited copper foil bonded to the laminate to permit its adhesive bond strength to be measured.

Flexural properties of the cured laminate were measured on laminate prepared from 11 layers of prepreg. Thermal stability of the cured laminates was measured by TGA analysis, measuring weight loss as the laminate was heated under nitrogen at a 10° C./min. rate. Comparative properties of laminate prepared from the modified epoxy formulations of Examples 9–11 are listed in the table below.

nates after solder immersion, it was evident that the control sample containing no alkylation-type hydrocarbon resin (Example 8) became much darker than the laminates of Examples 9–11. Addition of alkylation-type hydrocarbon resin in Examples 9 to 11 did not compromise the thermal

|  | Example 8 (comparative) | Example 9 | Example 10 | Example 11 |
|---|---|---|---|---|
| Brominated Epoxy Resin | 100 | 100 | 100 | 100 |
| Example 1 Alkylation Resin | — | 20 | 25 | — |
| Example 1B Alkylation resin | — | — | — | 20 |
| Epon 828 epoxy | — | — | 25 | — |
| DICY | 3.25 | 3.25 | 4.05 | 3.25 |
| 2-MI | 0.12 | 0.18 | 0.22 | 0.12 |
| wt % Binder in Prepreg | 40% | 40% | 40% | 41% |
| Dielectric Constant (1 Khz) | 4.99 | 4.90 | 4.75 | 4.68 |
| Dissipation Factor (1 Khz) | 0.0071 | 0.0039 | 0.0040 | 0.0040 |
| Volume Resistivity (ohm-cm) | 4.3 E15 | 1.2 E16 | 1.3 E16 | 1.3 E16 |
| Moisture Absorbtion (10 day immersion at 66° C.) | 1.19% | 0.68% | 0.65% | 0.69% |
| Flexural Modulus (kg/cm$^2$) | 255.000 | 257.000 | 262.000 | 256.800 |
| Flexural Strength (kg/cm$^2$) | 5592 | 5755 | 5440 | 5455 |
| 90° Peel adhesion to Cu (lb./in. width) | 8.8 | 9.6 | 10.9 | 11.0 |
| Thermal Decomposition by TGA (° C.) (Peak decomposition, 10° C./min. heating) | 343° C. | 352° C. | 351° C. | — |
| Tg (by TMA) | 126 | 111 | 115 | 113 |
| Thermal Expansion Coefficient (ppm/° C. in 25° C. to 250° C. range) | 178 | 185 | 181 | 154 |

Adding the alkylation-type hydrocarbon resin of Example 1 to the epoxy formulations listed above improved their dielectric properties and reduced their moisture absorbtion. Adding the alkylation-type hydrocarbon resin had little effect on mechanical integrity and appeared to improve adhesion to copper foil and thermal stability to a modest degree.

Laminate was prepared from 11 ply of the prepreg of Examples 8–11 where one side was coated with copper foil. Samples of these laminates were immersed in a solder bath under various conditions to compare the thermal stability of the various binders contained therein. Even when immersed in 575° F. solder for 60 seconds, none of the laminates of Examples 8–11 exhibited any sign of failure, such as blisters, delamination, or outgassing. Comparing the lamistability of the cured binder, rather the indication was that the stability was modestly improved in these binders.

Duplicate Examples 8,10,11

Duplicate prepreg samples were made to reproduce the results of Examples 8, 10, and 11. These prepreg samples (designated as 8B, 10B, and 11B) were used to make laminates bonded to copper foil for measuring peel strength, and 11 ply laminates for measuring thermal expansion and Tg by TMA. Results are listed in the table below.

|  | Examples 8 (comparative) | | Example 9 | | Examples 10 | | Examples 11 | |
|---|---|---|---|---|---|---|---|---|
| Brominated Epoxy Resin | 100 | | 100 | | 100 | | 100 | |
| Example 1 Alkylation Resin | — | | 20 | | 25 | | — | |
| Example 1B Alkylation resin | — | | — | | — | | 20 | |
| Epon 828 epoxy | — | | — | | 25 | | — | |
| DICY | 3.25 | | 3.25 | | 4.05 | | 3.25 | |
| 2-MI | 0.12 | | 0.18 | | 0.22 | | 0.12 | |
| wt % Binder in Prepreg | 40% | | 40% | | 40% | | 41% | |
|  | Example | | Example | | Example | | Example | |
|  | 8 | 8B | 9 | 9B | 10 | 10B | 11 | 11B |
| 90° Peel adhesion to Cu (lb./in. width) | 8.8 | 10.0 | 9.6 | | 10.9 | 11.7 | 11.0 | 10.7 |
| Tg, ° C. (by TMA) | 126 | 128 | 111 | | 115 | 115 | | 116 |
| Thermal Expansion Coefficient (ppm/° C. in 25° C. to 250° C. range) | 178 | 159 | 185 | | 181 | 209 | | 199 |
| Solder Stability (1 min. At 575° F.) | | Pass | | | | Pass | | Pass |

These duplicate prepreg samples demonstrate that the peel results were reproducible and that the solder stability and thermal stability by TGA were also reproducible. TMA results generally reproduce the values for the Tg of the cured binder, but a fairly wide variance in the measured values for the thermal expansion coefficient were observed. For laminate samples, the expansion coefficient is not only dependent on the expansion property of the binder, but is also strongly dependent on the volume % of binder in the laminate. The expansion coefficient is affected by the presence of tiny voids and residual stresses in the laminate.

sured more precisely than when glass impregnated laminates are used. Additionally dynamic mechanical analysis (DMA) testing was run on the laminates to determine the Tg of the cured binder by monitoring the change in elastic modulus of the material with increasing temperatures. These results are compared in the table below.

|  | Example 12 (comparative) | Example 13 | Example 14 | Example 15 | Example 16 |
|---|---|---|---|---|---|
| Brominated Epoxy Resin | 100 | 80 | 70 | 60 | 50 |
| Example 1 Alkylation Resin | — | 10 | 15 | 20 | 25 |
| Epon 828 epoxy | — | 10 | 15 | 20 | 25 |
| DICY | 2.6 | 2.6 | 2.6 | 2.6 | 2.6 |
| 2-MI | 0.10 | 0.14 | 0.14 | 0.14 | 0.14 |
| vol % Binder on Foil | 75% | 75% | 75% | 75% | 75% |
| Tg (by TMA) | 115° C. | 112° C. | 108° C. | 106° C. | 76°, 108° (2 phases) |
| Thermal Expansion Coefficient (ppm/° C. in 25° C. to 250° C. range) | 283 | 293 | 300 | 292 | 305 |
| Tg by Torsional Rectangular DMA | 121° C. | 119° C. | 119° C. | 115° C. | 113° |

Examples 12–16

Epoxy formulations modified with the alkylation-type hydrocarbon resin of Example 1 were coated onto copper foil, dried, and laminated to give samples containing nominally 75% by volume of the cured binder laminated between the foil surfaces (25 vol %). This technique permitted the expansion properties of the binder to be measured more precisely in the absence of the effect due to the fiberglass.

In Example 12 (comparative), a solution of DER 521 A-80 brominated epoxy resin was combined with a DICY curative solution and the mixture was coated onto a sheet of 1 oz/sq. ft. electrodeposited copper foil using a wire wrapped rod to achieve a uniform wet coating of about 5 mils. The coated foil was dried in a forced air oven for 3 minutes at 90° C. and 3 minutes at 140° C. to remove volatile solvent. The final foil contained a non-tacky epoxy coating of approximately 4 mils thick.

In Example 13 a similar coated foil was prepared as in Example 12 except that 20% of the brominated epoxy was replaced by a 50/50 mixture of the alkylation-type hydrocarbon resin of Example 1 combined with Epon 828 epoxy resin. Example 14 was similarly prepared except that 30% of the brominated epoxy resin was substituted. In Example 15 the epoxy mixture contained 40% of the alkylation-type hydrocarbon resin mixture used in Examples 13 and 14, while in Example 16 the amount was increased to 50%. The composition of each of the mixtures is listed in the table below.

Laminates were prepared from the foils of Examples 12–16 by layering 14 ply of the coated foils together and laminating them in a heated press and curing the binder for 2 hours at 190° C. The final foil contained about 74 vol % binder as layers between the 14 layers of copper foil comprising 26 vol % of the laminate. The high vol % of binder in the laminate coupled with the precisely measurable value for the total thickness of all the epoxy layers permitted the thermal expansion coefficient of the binder to be measured more precisely than when glass impregnated laminates are used.

Adding the alkylation-type hydrocarbon resin of Example 1 to the epoxy formulation had little effect on the thermal expansion coefficient (CTE). Any increase is on the order of 3% to 5%. The lower Tg values relative to values measured in earlier examples, was attributed to the level of DICY used in the formulations of Examples 12–16. Alternate formulations were tested where Epon 1123 A-80 epoxy was substituted for the DER 521 in Examples 12–16 and nearly identical results were measured.

Reduction in Tg caused by adding the alkylation-type hydrocarbon resin in Examples 13 to 16 was partly offset by substituting some of the brominated epoxy resin with general purpose non-brominated Epon 828 epoxy resin. Modifying the formulation to include some Bis A epoxy resin, similar to Epon 828, along with the alkylation-type hydrocarbon resin of this invention is a means to retain higher Tg values.

In Example 16, two transitions were noted both by TMA and DMA. The transitions were attributed to a second phase in the material, expected to be a hydrocarbon-rich phase. This illustrates that the point of saturation or compatibility limit of the alkylation resin of Example 1 in the epoxy matrix is approximately 20% by weight.

Although the invention has been described with reference to particular materials and embodiments, it is to be understood that the invention is not limited to the particulars disclosed and extends to all equivalents within the scope of the claims.

I claim:

1. An epoxy/alkylation hydrocarbon resin alloy comprising: an epoxy resin; an alkylation hydrocarbon resin; and a curative, wherein the alkylation hydrocarbon resin is an alkylation reaction product between a cyclic diolefin and an alkylnaphthalene solvent.

2. The epoxy/alkylation hydrocarbon resin alloy of claim 1 wherein the cyclic diolefin is dicyclopentadiene.

3. The epoxy/alkylation hydrocarbon resin alloy of claim 2 wherein the alkylation hydrocarbon resin has molecular weight values (MW) less than about 10,000, measured by size exclusion chromatography.

4. The epoxy/alkylation hydrocarbon resin alloy of claim 3 wherein the alkylation hydrocarbon resin has molecular weight values (MW) less than 5,000, measured by size exclusion chromatography.

5. The epoxy/alkylation hydrocarbon resin alloy of claim 3 wherein the alkylation hydrocarbon resin has molecular weight values (MW) less than 3,000, measured by size exclusion chromatography.

6. The epoxy/alkylation hydrocarbon resin alloy of claim 1 wherein the alkylation hydrocarbon resin is added to the epoxy resin at levels up to about 25% by weight.

7. The epoxy/alkylation hydrocarbon resin alloy of claim 6 wherein the alkylation hydrocarbon resin is added to the epoxy resin at levels up to about 10% to 25% by weight.

8. The epoxy/alkylation hydrocarbon resin alloy of claim 7 wherein the alkylation hydrocarbon resin is added to the epoxy resin at levels up to about 17.5% to 20% by weight.

9. The epoxy/alkylation hydrocarbon resin alloy of claim 1 wherein the epoxy resin comprises a Bisphenol A diglycidylether epoxy resin.

10. The epoxy/alkylation hydrocarbon resin alloy of claim 1 wherein the epoxy resin comprises a brominated epoxy resin.

11. The epoxy/alkylation hydrocarbon resin alloy of claim 1 wherein the curative may be selected from the group consisting of dicyanodiamide (DICY) and imidazole.

12. The epoxy/alkylation hydrocarbon resin alloy of claim 1 wherein the curative comprises dicyanodiamide (DICY).

13. A prepreg comprising:
   a matrix impregnated with an epoxy/alkylation hydrocarbon resin alloy comprising;
   an epoxy resin; an alkylation hydrocarbon resin; and a curative, wherein the alkylation hydrocarbon resin is an alkylation reaction product between a cyclic diolefin and an alkylnaphthalene solvent.

14. The prepreg of claim 13 wherein the matrix comprises glass fabric.

15. The prepreg of claim 14 wherein the cyclic diolefin is dicyclopentadiene.

16. The prepreg of claim 15 wherein the alkylation hydrocarbon resin has molecular weight values (MW) less than about 10,000, measured by size exclusion chromatography.

17. The prepreg of claim 16 wherein the alkylation hydrocarbon resin has molecular weight values (MW) less than about 5,000, measured by size exclusion chromatography.

18. The prepreg of claim 17 wherein the alkylation hydrocarbon resin has molecular weight values (MW) less than about 3,000, measured by size exclusion chromatography.

19. The prepreg of claim 15 wherein the alkylation hydrocarbon resin is added to the epoxy resin at levels up to about 25% by weight.

20. The prepreg of claim 19 wherein the alkylation hydrocarbon resin is added to the epoxy resin at levels up to about 10% to 25% by weight.

21. The prepreg of claim 20 wherein the alkylation hydrocarbon resin is added to the epoxy resin at levels up to about 17.5% to 20% by weight.

22. The prepreg of claim 15 wherein the epoxy resin comprises a Bisphenol A diglycidylether epoxy resin.

23. The prepreg of claim 15 wherein the epoxy resin comprises a brominated epoxy resin.

24. The prepreg of claim 15 wherein the curative may be selected from the group consisting of dicyanodiamide (DICY) and imidazole.

25. The prepreg of claim 15 wherein the curative comprises dicyanodiamide (DICY).

26. A laminate comprising:
   a metal foil bonded to an outside layer of a prepreg wherein the prepreg comprises;
      a matrix impregnated with an epoxy/alkylation hydrocarbon resin alloy comprising;
         a) an epoxy resin;
         b) an alkylation hydrocarbon resin, wherein the alkylation hydrocarbon resin is an alkylation reaction product between a cyclic diolefin and an alkylnaphthalene solvent; and
         c) a curative.

27. The laminate of claim 26 wherein the matrix comprises glass fabric.

28. The laminate of claim 27 wherein the metal foil comprises copper.

29. The laminate of claim 28 wherein the cyclic diolefin is dicyclopentadiene.

30. The laminate of claim 29 wherein the alkylation hydrocarbon resin has molecular weight values (MW) less than about 10,000, measured by size exclusion chromatography.

31. The laminate of claim 30 wherein the alkylation hydrocarbon resin is added to the epoxy resin at levels up to about 25% by weight.

32. The laminate of claim 31 wherein the epoxy resin comprises a Bisphenol A diglycidylether epoxy resin.

33. The laminate of claim 31 wherein the curative comprises dicyanodiamide (DICY).

34. A process of producing a prepeg comprising the steps of:
   a) dissolving an alkylation hydrocarbon resin in a liquid epoxy to form a mixture, wherein the alkylation hydrocarbon resin is an alkylation reaction product between a cyclic diolefin and an akylnaphthalene solvent;
   b) adding a curative to the alkylation hydrocarbon resin/epoxy mixture;
   c) impregnating a matrix with the alkylation hydrocarbon resin/epoxy mixture containing the curative; and
   d) advancing the epoxy's cure to provide the epoxy/alkylation hydrocarbon resin alloy.

* * * * *